US 6,744,511 B1

(12) United States Patent
Saiki et al.

(10) Patent No.: US 6,744,511 B1
(45) Date of Patent: Jun. 1, 2004

(54) STAGE DEVICE HAVING DRIVE MECHANISM FOR DRIVING A MOVABLE STAGE, AND EXPOSURE APPARATUS AND METHOD OF DETECTING POSITION OF THE STAGE

(75) Inventors: Kazuaki Saiki, Tokyo (JP); Tomohide Hamada, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/372,343

(22) Filed: Aug. 11, 1999

(30) Foreign Application Priority Data

Aug. 11, 1998 (JP) .......................................... 10-227065
Sep. 3, 1998 (JP) .......................................... 10-248902

(51) Int. Cl.[7] ............................................. G01B 11/02
(52) U.S. Cl. ..................................................... 356/399
(58) Field of Search .................................. 356/399, 400

(56) References Cited

U.S. PATENT DOCUMENTS 5,539,497 A * 7/1996 Nishi ........................... 355/53
5,699,145 A   12/1997 Makinouchi et al.
5,828,573 A * 10/1998 Hayashi ...................... 700/121
6,057,921 A *  5/2000 Yao ............................. 356/500
6,169,603 B1 *  1/2001 Takayama ................... 356/500
6,285,437 B1 *  9/2001 Tokunaga ...................... 355/53

FOREIGN PATENT DOCUMENTS

JP          08-293459      *  5/1996    ......... H01L/21/027

* cited by examiner

Primary Examiner—Frank G. Font
Assistant Examiner—Andrew H. Lee
(74) Attorney, Agent, or Firm—Oliff & Berridge PLC

(57) ABSTRACT

An exposure device which includes a stage device having a first stage which movably supports an object and a drive mechanism which drives the first stage in at least a first direction. The first stage has a first portion coupled to the drive mechanism and a second portion for supporting the object. The first stage device is configured with a first position measuring device which measures the position of the first portion in a predetermined measurement direction. The exposure device further includes a first stage control system which controls the drive mechanism to control the position of the object in at least a first direction based on a measurement result obtained by the first position measuring device.

20 Claims, 9 Drawing Sheets

STAGE DEVICE HAVING DRIVE MECHANISM FOR DRIVING A MOVABLE STAGE, AND EXPOSURE APPARATUS AND METHOD OF DETECTING POSITION OF THE STAGE

BACKGROUND OF THE INVENTION

1. Field of the Invention

The present invention relates to exposure devices used in lithographic processes for the manufacture of liquid crystal displays, integrated circuits, thin film magnetic heads, etc., and to stage and corresponding position detection devices suitable for use with such exposure devices.

2. Description of the Related Art

Lithographic processes utilized during the manufacture of liquid crystal displays, integrated circuits, and other similar devices usually involve exposure devices. Such exposure devices have been used to image a mask pattern onto a substrate. Such exposure devices include step and repeat type devices (often referred to as a "liquid crystal stepper") and batch transfer scanning type devices which transfer a pattern of a mask onto a plate (e.g., a glass substrate). Such devices typically scan a mask stage and a plate stage in the same relative direction with respect to a projection optical system.

Recent developments have been made in regard to exposure devices as a result of increased demand for larger liquid crystal displays, etc. Accompanying such increases, plate sizes within exposure devices have correspondingly increased. Accordingly, scan type exposure devices have been developed which are capable, of exposing a large surface compared to a stepper, and which perform exposures of plural shots with respect to one plate.

Exemplary exposure devices are illustrated in several drawing figures which have been attached to this patent document. Reference is now made to drawing figures identified as FIGS. 5, 6, 7, and 9, respectively.

FIG. 5 shows a batch transfer type scanning exposure device. FIG. 6 shows in more detail the stage control device 101 shown in FIG. 5. In FIG. 5, a mask stage MST and plate stage PST are respectively supported on air pads (not shown in the drawing) on an upper surface plate 102a and a lower surface plate 102b which make up the body column 102 which supports the projection optical system PL. The mask stage MSK and plate stage PST are moved by linear motors 104 and, 106 in right and left scanning directions. The stator 104a of the linear motor 104 which drives the mask stage MST is fixed to the upper surface plate 102a, and its moving element 104b is fixed to the mask stage MST. Moreover, the position of the mask stage MST in the scanning direction is constantly measured by means of a laser interferometer 108 which is fixed to the body column 102.

The stator 106a of the linear motor 106 which drives the plate stage PST is fixed to the lower surface plate 102b, and its moving element 106b is fixed to the plate stage PST. The plate stage PST is equipped with a moving table 110 to which moving element 106b is fixed, and with a substrate table 116 which is loaded on this moving table 110 via a Z·θ movement mechanism 114. The position of the substrate table 116 in the scan direction is constantly measured by means of a laser interferometer 112 which is fixed to the body column 102.

The arrangement of stage control device 101 is now described with reference to FIG. 6. As shown in FIG. 6, a position control loop of the plate stage PST includes interferometer 112, a subtractor 118, a plate stage servo operating unit 120, a plate stage drive amplifier 122, and linear motor 106 which is driven by the drive signal S2 output from plate stage drive amplifier 122. Moreover, plate stage position information S1 from the interferometer 112 is fed back as input to the plate stage servo operating unit 120 via a differencing unit 124. Accordingly, a speed control loop is constituted as the inner loop (minor loop) of the position control loop. The reference position is input from the reference value output unit 126 with respect to the subtractor 118 of the aforementioned position control loop. By means of the position and speed control loop of the plate stage PST constituted in this way, position and speed control of the plate stage are performed such that the position deviation, which is the difference of the reference position and the output of the interferometer 112, becomes zero.

Similarly, a position control loop of the mask stage MST includes interferometer 108, a subtractor 128, a mask stage servo operating unit 130, a mask stage drive amplifier 132, and the linear motor 104 which is driven by the drive signal S4 output from mask stage drive amplifier 132. The plate stage position information S1, which is the output of the interferometer 112 with respect to the subtractor 128 of this position control loop, is input as the reference position. Accordingly, by means of the position control loop of the mask stage MST, slave control of the mask stage MST is performed with respect to the plate stage PST, such that the positional deviation, which is the difference of the output S1 of the interferometer 112 and the output S3 of the interferometer 108, becomes zero.

Referring now to FIG. 9, depicted therein is another scanning type exposure device. In particular, an illuminating optical system 201 and a projection optical system 204 are fixed to a base 210 by means of a B column 208. On a carriage 207 for scanning use arranged to move freely with respect to base 210 there is located a mask 202 which is movable a small amount with respect to carriage 207 via a mask stage 203. A substrate 205 is located such that a substrate stage 206 is movable a small amount with respect to the same carriage 207 (the fixed portions are drawn with thick lines, and the movable portions with thin lines). By scanning the carriage 207, the mask 202 and substrate 205 scan in a predetermined direction with respect to the projection optical system 204, and the pattern of the mask 202 successively transfers onto the substrate 205. A laser interferometer 222 is supported by an A column 209, and by means of the interference of light reflected from a fixed mirror 211 arranged in the projection optical system 204 and light reflected from a moving mirror 212 arranged in the substrate stage 206, the position of the substrate stage 206 with respect to the projection optical system 204 is detected. The position information of the substrate stage 206 from the laser interferometer 222 is input into the main control device 240. The main control device 240 is equipped with a speed adjustment operating unit 218 which outputs speed adjustment instructions according to an exposure program. A servo operating unit 220 calculates and outputs the drive signals for the carriage 207 based on the difference of the speed adjustment instructions and the position information of the substrate stage 206, and for a drive amplifier 221 which amplifies the output of the servo operating unit 220. The control unit 217 controls the carriage 207 by means of the output of the drive amplifier 221. The laser interferometer 222, main control device 240 and control unit 217 make up a servo loop that controls the carriage 207. That is, the substrate stage 206 is positioned based on the position information of the substrate stage 206 and the speed adjustment instructions output from the speed adjustment operating unit 218.

Despite their widespread use, the exposure devices discussed above are not without their problems. For example, in a closed loop control system, the bandwidth or the frequency at which the gain of the closed loop frequency characteristic becomes √(½)-fold of the low frequency gain as the frequency ω→0, and when expressed in dB, falls 3 dB from the low frequency gain of ω→0.

With a stage control system as shown in FIG. 6, the plate stage control performance is set, for example, by means of the response band of the plate stage position and speed control loop during the fixed speed control (uniform speed control) of the plate stage performed in the scanning exposure time, the variable speed, adjustment characteristics, speed fluctuation, or during the position setting control of the plate stage performed in the shot interval stepping times in the case of step and scan type of exposure device, the variable speed, speed adjustment, position setting accuracy and the like.

Nevertheless, in the aforementioned prior art stage control device, measuring the position of the substrate table 116 by means of the interferometer 112, separated from the linear motor 106 which is the drive source, based on this the substrate table 116 and the moving element 106b of the linear motor 106, with respect to the moving table 110 which was fixed, position control of the scanning direction of the plate stage to the unrelated Z-θ movement mechanism 114 exists. Low frequency mechanical natural vibrations as a resonant mode are included in the plate stage position and velocity control loop. In this case, for example, during drive of the plate stage, when the resonant frequency rises beyond the aforementioned Z-θ drive mechanism 114, because the position information of the substrate table 116 which received the effects of this resonant frequency is input as feedback into the position control loop, it becomes difficult to control the position and speed of the plate stage. Accordingly, in prior art stages control systems, the response band of the position and speed control loop of the plate stage cannot be made sufficiently wide, and as a result, there is the disadvantage that the plate stage control performance cannot be made sufficiently high.

In FIGS. 7(A) and (B), the frequency response characteristics and phase characteristics of the position control loop of the plate stage PST are respectively shown, in the prior art stage control system when the frequency of the aforementioned resonant vibration was 60 Hz. As is clear from FIG. 7, the response band of the plate stage became about 10 Hz.

Moreover, as a result that the plate stage control performance can not be made sufficiently high, overshoot arises after the end of variable speed of the plate stage PST (response of the system exceeding the expected value in the case that a sudden change occurred in the input, or overshooting amount), undershoot (the reverse of overshoot; the response does not reach the expected value, in the case of a sudden change in the input) becomes large, and is an inconvenience that the mask stage slave control performance becomes poor, while performing the plate stage position as a position instruction.

However, a problem similar to the aforementioned plate stage movement problem arises in an XY stage of a 2-stage structure which loads the X stage via a drive mechanism of the X stage on the upper portion of the Y stage, or in the fine movement stage loaded via the upward drive mechanism of the coarse movement stage in the control system of a reticle stage of the so-called coarse-fine movement structure.

Furthermore, in the scanning type exposure device of FIG. 9, effects are realized as a result of the vibration of the movement of the carriage 207 or of other devices, and because the B column 208 vibrates at its natural vibration frequency, for example 50 HZ. In order to avoid oscillation, the control band of the aforementioned servo loop can only be taken as at most ⅓ of this, around 10 Hz. Accordingly, this becomes a bottleneck, and the control performance of the servo loop cannot be raised.

SUMMARY OF THE INVENTION

The present invention's principle objects are to solve the problems mentioned above and to provide a stage control device for use with an exposure device that delivers increased stage control performance. The present invention provides for increased control performance of a stage without realizing the effects of vibration often associated with stage position detection. By providing such a stage control device, the present invention delivers increased throughput and pattern transfer accuracy.

Accordingly, the present invention provides an exposure device that includes a stage device having a first stage which movably supports an object and a drive mechanism which drives the first stage in at least a first direction. The first stage has a first portion for supporting the object and a second portion coupled to the drive mechanism. The first stage device is configured with a first position detecotor which optically measures the position of the first portion in a predetermined measurement direction. The exposure device further includes a second position detector which optically measures the position of the second portion in the same predetermined measurement direction.

BRIEF DESCRIPTION OF THE DRAWING FIGURES

Figure 4A:
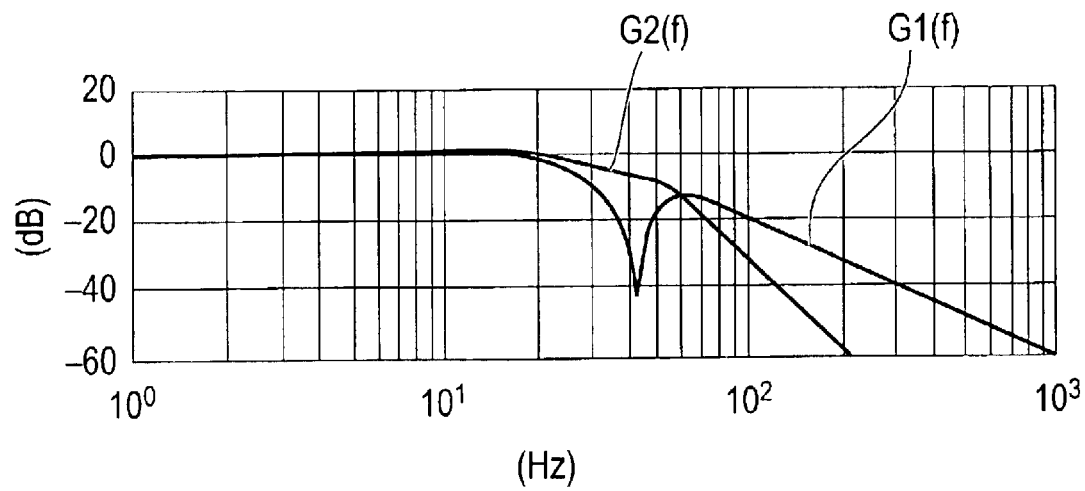
Figure 4B:
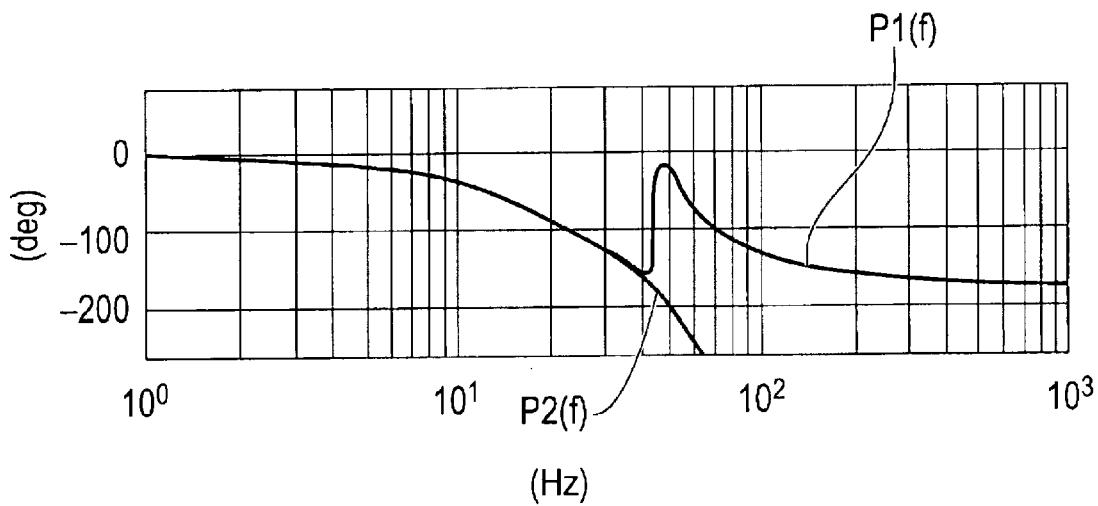
Figure 5:
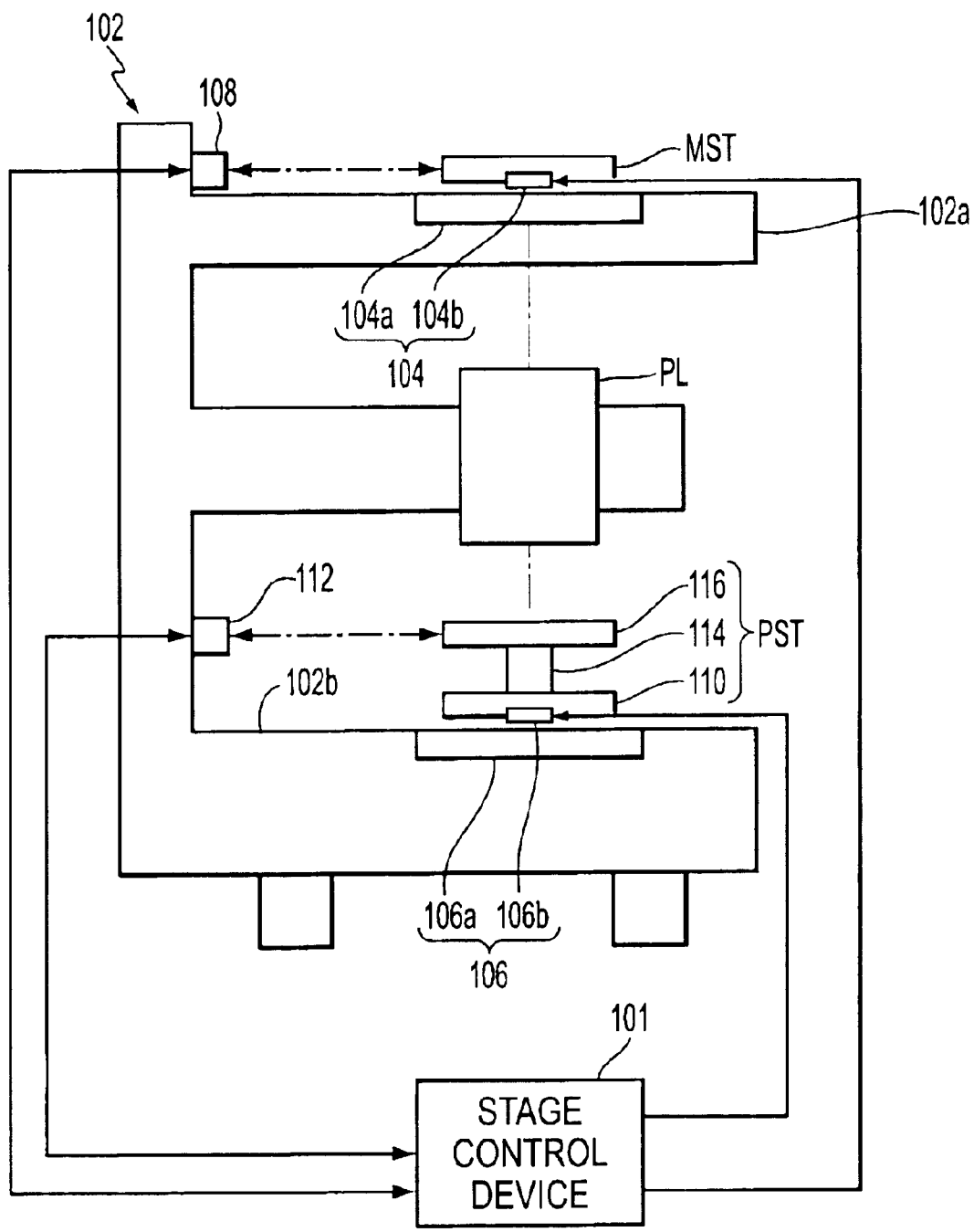
Figure 6:
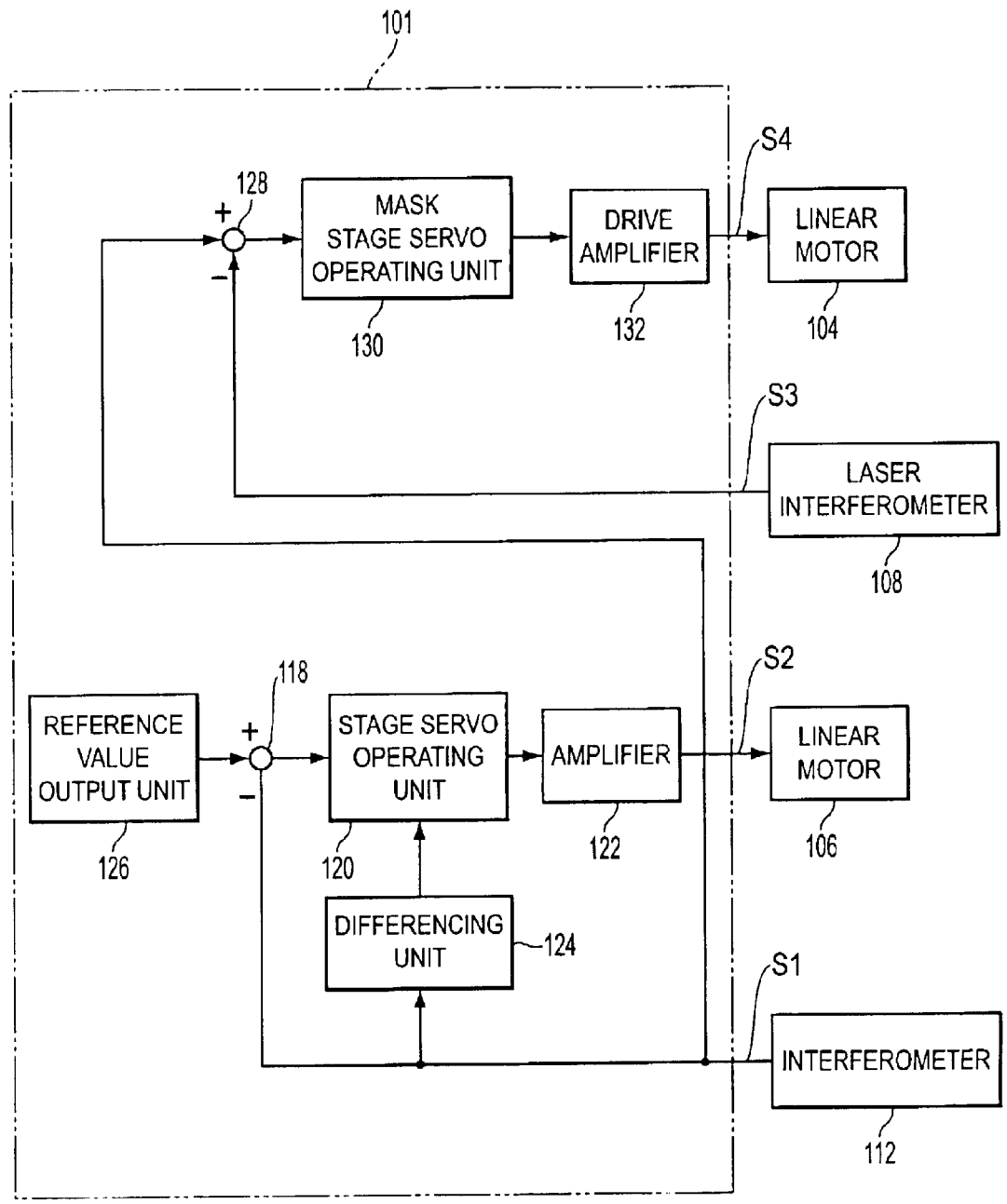
Figure 7A:
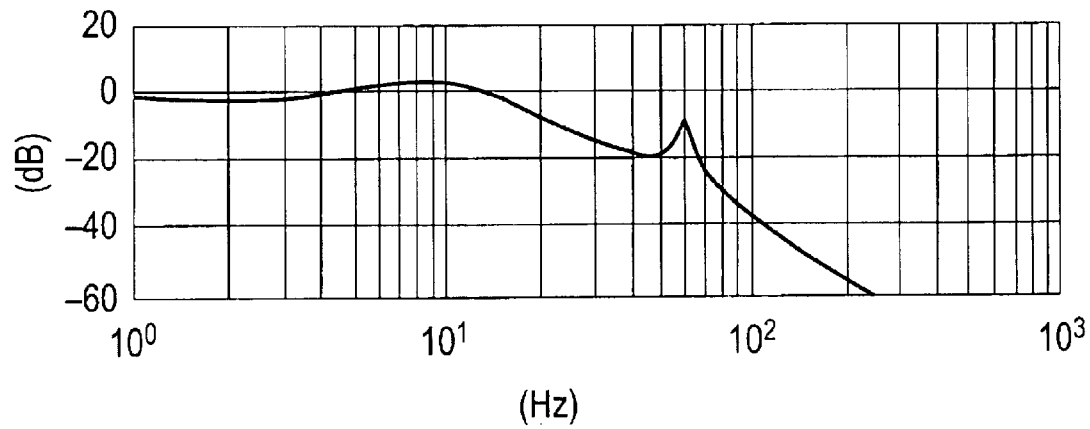
Figure 7B:
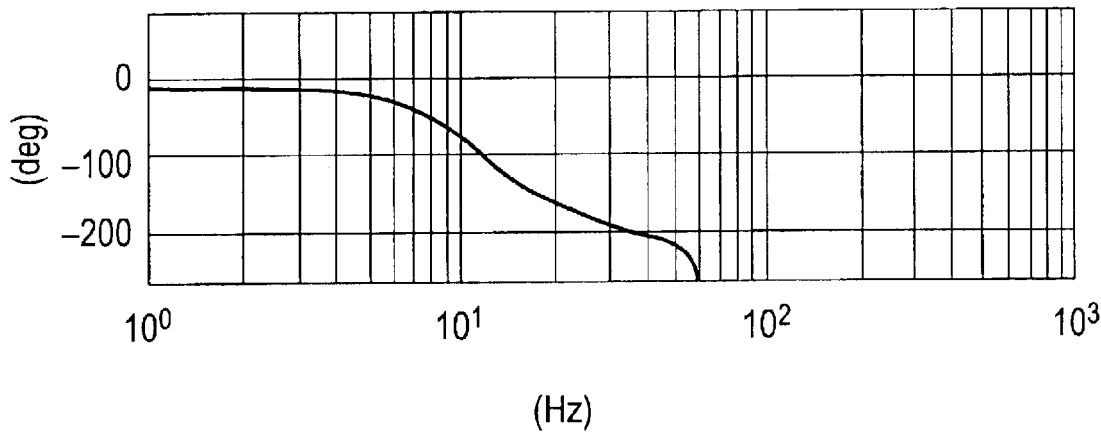
Figure 8:
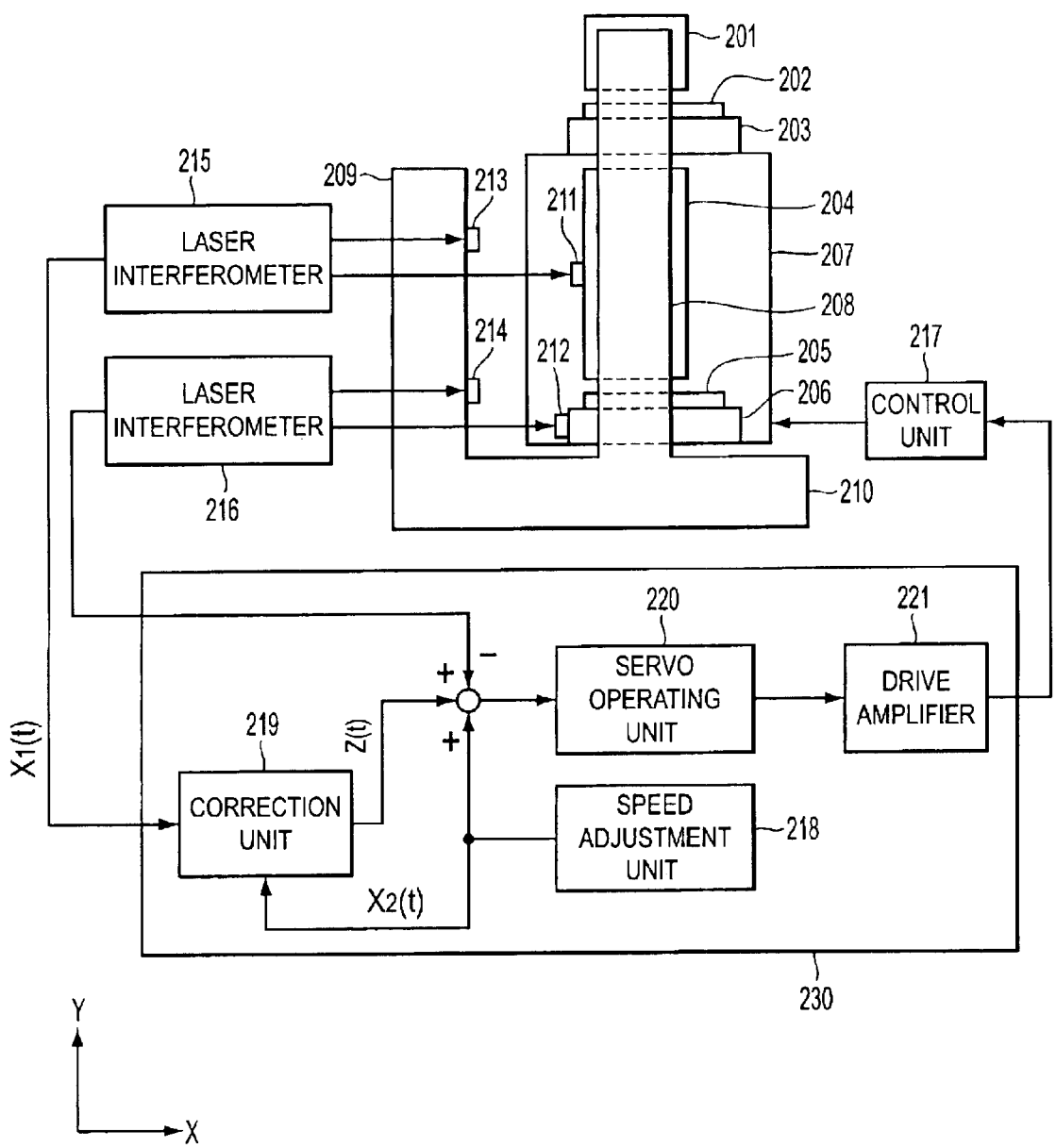
Figure 9:
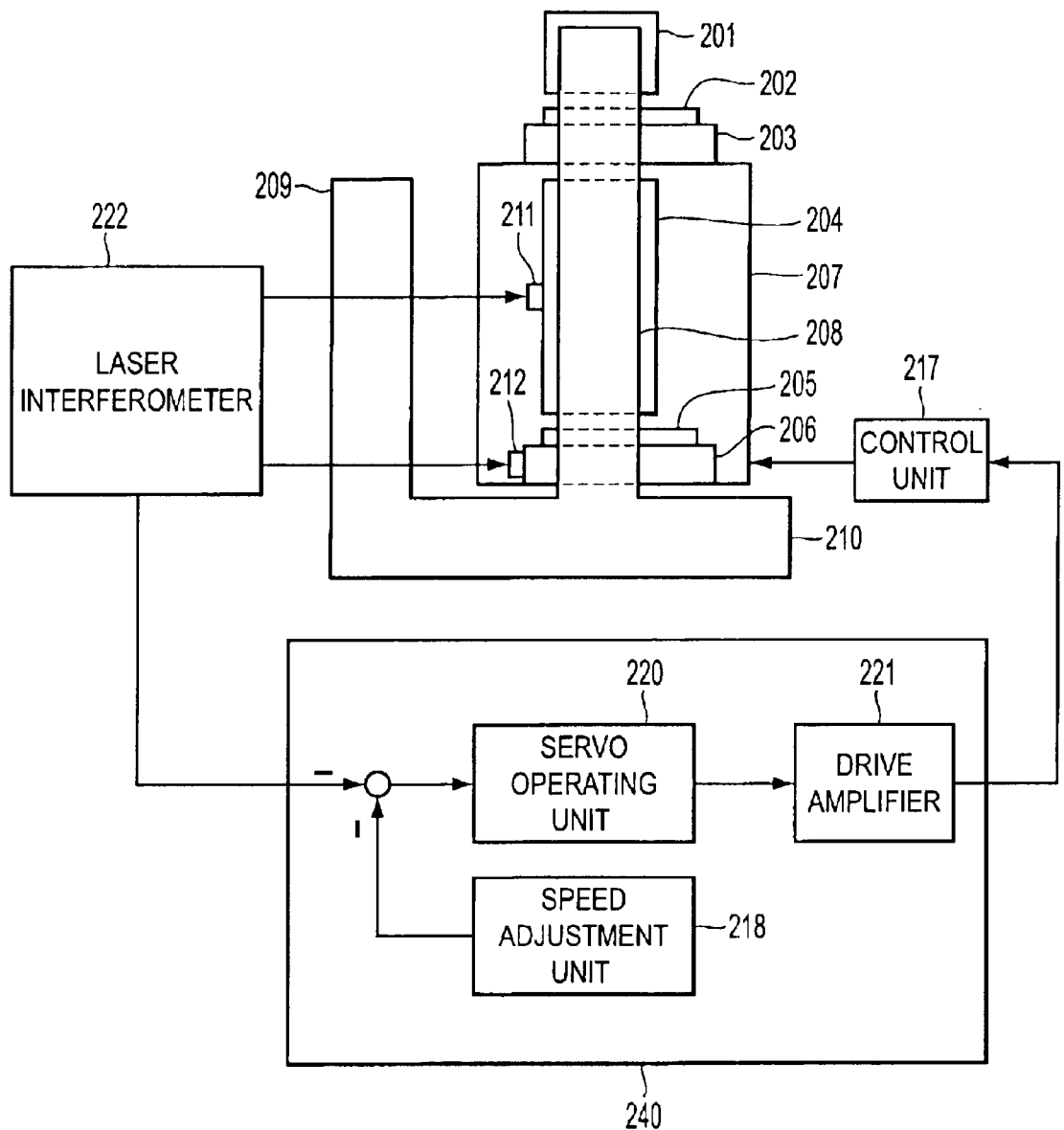

FIGS. 4(A) and 4(B), respectively show gain and phase (i.e., Bode diagrams) frequency response characteristics of a stage control device according to the present preferred embodiment obtained by simulation results with a natural vibration frequency taken as 60 Hz;

FIG. 5 is a schematic diagram of a prior art exposure device;

FIG. 6 is a block diagram of a prior art stage control device;

FIGS. 7(A) and (B) are Bode diagrams showing, in the prior art stage control system (specifically, the plate stage position control loop), in the frequency response characteristics, the gain characteristics, phase characteristics, in the case that the frequency of the natural vibration was 60 Hz;

FIG. 8 is a side view of a scanning exposure device of the present preferred embodiment; and FIG. 9 is a schematic diagram showing an example of a prior art scanning type exposure device.

DETAILED DESCRIPTION OF THE PREFERRED EMBODIMENTS

The present invention is now discussed with reference to the drawing figures that were briefly described above. A discussion of each preferred embodiment of the present invention is followed by a corresponding discussion of its operation. Unless otherwise specified, like parts and processes are referred to with like reference numerals.

Figure 1:
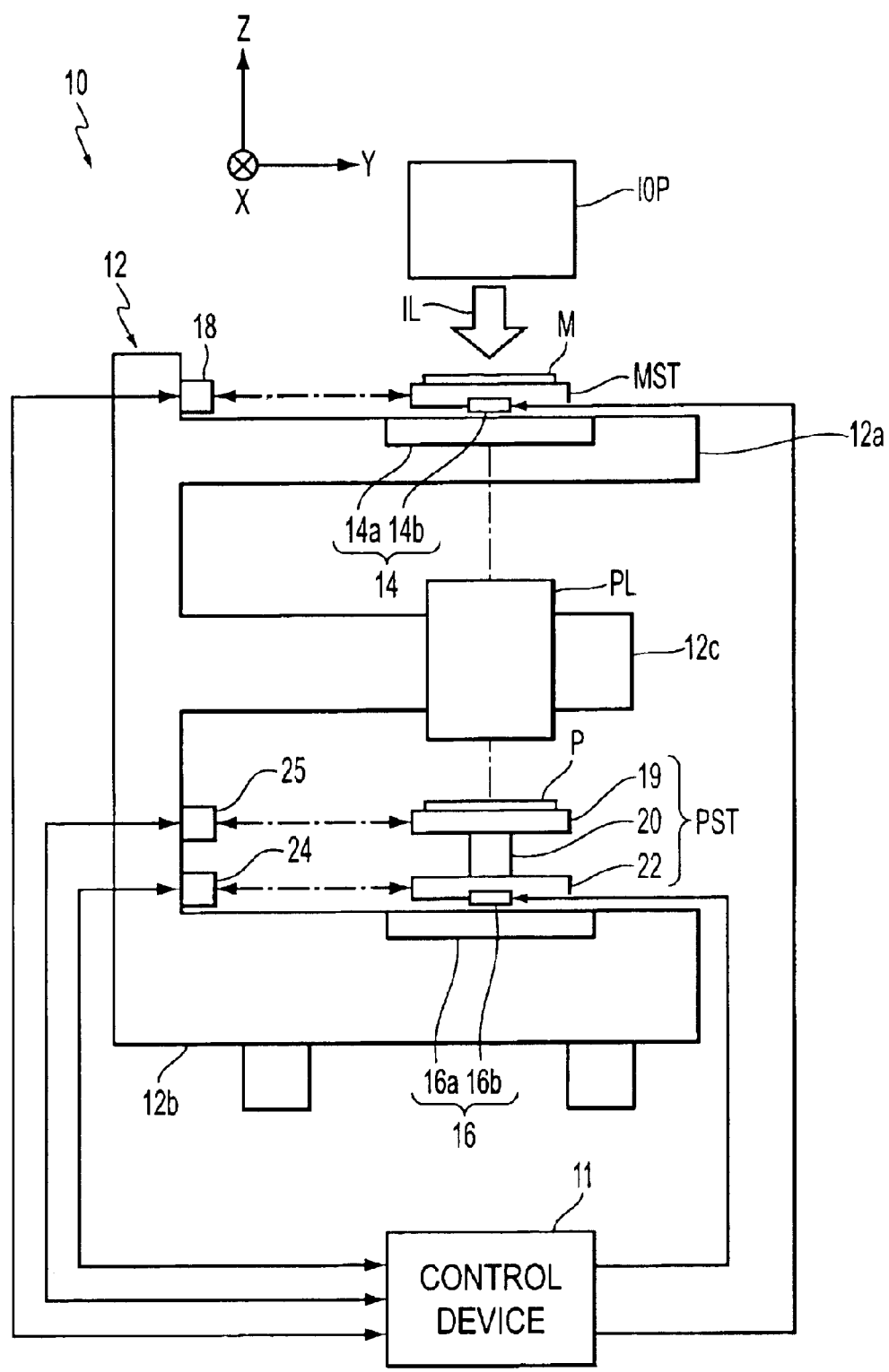
FIG. 1 is a schematic diagram of an exposure device provided in accordance with a preferred embodiment of the present invention.

Referring now to FIG. 1, depicted therein is a schematic diagram of a preferred embodiment of an exposure device provided in accordance with the present invention. Exposure device 10 is an equal magnification batch transfer scanning type exposure device which transfers a pattern formed on a mask M onto a plate P by means of correspondingly scanning mask M, containing a liquid crystal display element pattern, and a substrate, which is a glass plate (termed "plate" below) P, supported on a plate stage PST (i.e., a first stage), in the same direction and at the same speed along a predetermined scanning direction (here, taken as the Y direction in FIG. 1).

Exposure device 10 is equipped with an illuminating system IOP which illuminates a predetermined slit shaped illumination region such as a region of elongated rectangular form or circular arcuate form extending in the X axis direction in FIG. 1. and onto mask stage MST (i.e., a second stage) which moves in the Y axis direction and which supports the mask M formed with the pattern. A projection optical system PL projects onto the plate P illuminating light IL (an illumination region for exposure use) which has passed through the aforementioned illumination region portion of mask M. A plate stage PST moves in the Y axis direction and supports plate P. A body column 12 movably supports mask stage MST and plate stage PST, and supports projection optical system PL. Exposure device 10 is also equipped with control device 11 which controls both the aforementioned stages MST, PST.

The aforementioned illuminating system IOP may be similar or like one disclosed in Japanese Laid-Open Patent Publication Number JP-H9-320956 which is incorporated herein by reference. Such an illuminating optical system IOP includes a light source unit, a shutter, a secondary light source forming an optical system, a beam splitter, a condensing lens system, a visual field diaphragm (blind), and an imaging lens system, to uniformly illuminate, as described next, the aforementioned slit shaped illumination region on mask M supported and positioned on mask stage MST.

Mask stage MST, by means of air pads (not shown in the drawing), is float supported with a few microns clearance above the upper surface of an upper surface plate 12a constituting the column 12, and is driven in the Y axis direction by means of a drive mechanism 14.

Because a linear motor is used here as the drive mechanism 14 which drives the mask stage MST, this drive mechanism is termed below the "linear motor 14." The stator 14a of linear motor 14 is fixed to the upper portion of the upper surface plate 12a, and extends along the Y axis direction. The movable element 14b of the linear motor 14 is fixed to the mask stage MST. Moreover, the position of the mask stage MST in the Y direction is normally measured by means of a laser interferometer 18 (or, "mask-use interferometer"). The mask stage position measurement is made; with reference to the projection optical system PL 86, for example, with a resolving power of a few nm. The Y direction information S3 of the mask stage MST measured by the interferometer 18 is supplied to the control device 11 (see FIG. 2).

The aforementioned projection optical system PL is arranged below the upper surface plate 12a of the body column 12, and is supported by means of a support member 12c which is part of column 12. The projection optical system PL is used to projects an erect image. Accordingly, when the aforementioned slit shaped illumination region on the mask M is illuminated by means of exposure use illuminating light IL from the illuminating optical system IOP, the equal magnification image (partial erect image) of a circuit pattern from the illumination region on mask M becomes projected to the conjugate region to be exposed in the aforementioned illumination region on plate P. Furthermore, for example, as disclosed in JP-H7-57986 (corresponding to U.S. Pat. No. 5,729,331), the projection optical system PL may constitute plural sets of equal magnification erect image projection optical system units. The disclosure of U.S. Pat. No. 5,729,331 is hereby incorporated by reference.

The aforementioned plate stage PST, arranged below the projection optical system PL, is float on air pads (not shown in the drawing) supported with a clearance of a few microns above the upper surface of the lower surface plate 12b which constitutes the body column 12. This plate stage PST is driven in the Y axis direction by means of a linear motor 16 as a drive mechanism. The stator 16a of this linear motor 16 is fixed to the lower surface plate 12b, and extends along the Y axis direction. The moving element 16b of the linear motor 16 is fixed to the bottom portion of the plate stage PST.

The plate stage PST is equipped with a moving table 22 as a first portion to which the moving element 16b of the aforementioned linear motor 16 is fixed, with a Z·θ movement mechanism 20 loaded on this moving table 22, and with a substrate table 19 as a second portion on which the upper portion of the Z·θ drive mechanism 20 is located. A plate P is loaded on the substrate table 19, and is held firm by a vacuum chuck (not shown in the drawing). The substrate table 19 is suitable for fine driving in the Z-axis (up and down) direction and rotary direction by means of the Z·θ drive 20.

The position of the aforementioned moving table 22 is measured in the Y axis direction is by means of a first interferometer 24, use as a first position measuring device. The first interferometer 24 is fixed to the body column 12 and uses the projection optical system PL as a reference at a predetermined resolving power, for example, a resolving power of a few nm. The Y direction position information S0 of the moving table 22 measured by this first interferometer 24 for table use is supplied to the control device 11 (see FIG. 2).

Moreover, the position in the Y axis direction of the aforementioned substrate table 19 is usually measured by means of a second interferometer 25, as a second position measuring device. The second interferometer 25 is fixed to the body column 12 and uses the projection optical system PL as a reference at a predetermined resolving power, for example, a resolving power of a few nm.

Here, a 2-axis interferometer is used as the second interferometer 25 which illuminates the substrate table 19 with 2 measuring beams in the Y axis direction, spaced apart a predetermined distance L in the X ax is direction, which is at a right angles to the Y axis direction (at right angles to the plane of the pa per in FIG. 1); the measurement value of each measuring axis is supplied to the control device 11 (and via this to a main control device, not shown in the drawing). When the measurement values of the respective measuring axes of this second plate use interferometer 25 are denoted by Y1, Y2, the position of the substrate table 19 in the Y axis direction can be found by means of the equation $Y=(Y1+Y2)/2$, and the rotation amount of the substrate table 19 around the Z axis can be found by means of the equation $\theta=(Y1-Y2)/L$. In the description below, other than in particularly necessary cases, the aforementioned Y from the second plate use interferometer 25 is output as Y position information S1 of the substrate table 19.

Furthermore, in this embodiment, a focus position detection system (not shown in the drawing) which measures the Z direction position of the plate PT (for example, an oblique incident light type of focus position detection system), is fixed to the support member 12c which supports the projection optical system PL. The Z position information of the plate P measured by the focus position detection system is supplied to a main control device (not shown in the drawing). Based on this Z position information the main control device controls the auto-focus operation, for example, during scanning exposure, causing the Z position of the plate P to coincide with the imaging surface of the projection optical system PL via the Z·θ drive mechanism 20, based on this Z position information. Furthermore, the main control device can control the rotation of plate P during scanning exposure via, the Z·θ drive mechanism 20, based upon the aforementioned θ calculated above, or based on the rotation error of the two found from the alignment result of the mask M and the plate P.

Figure 2:
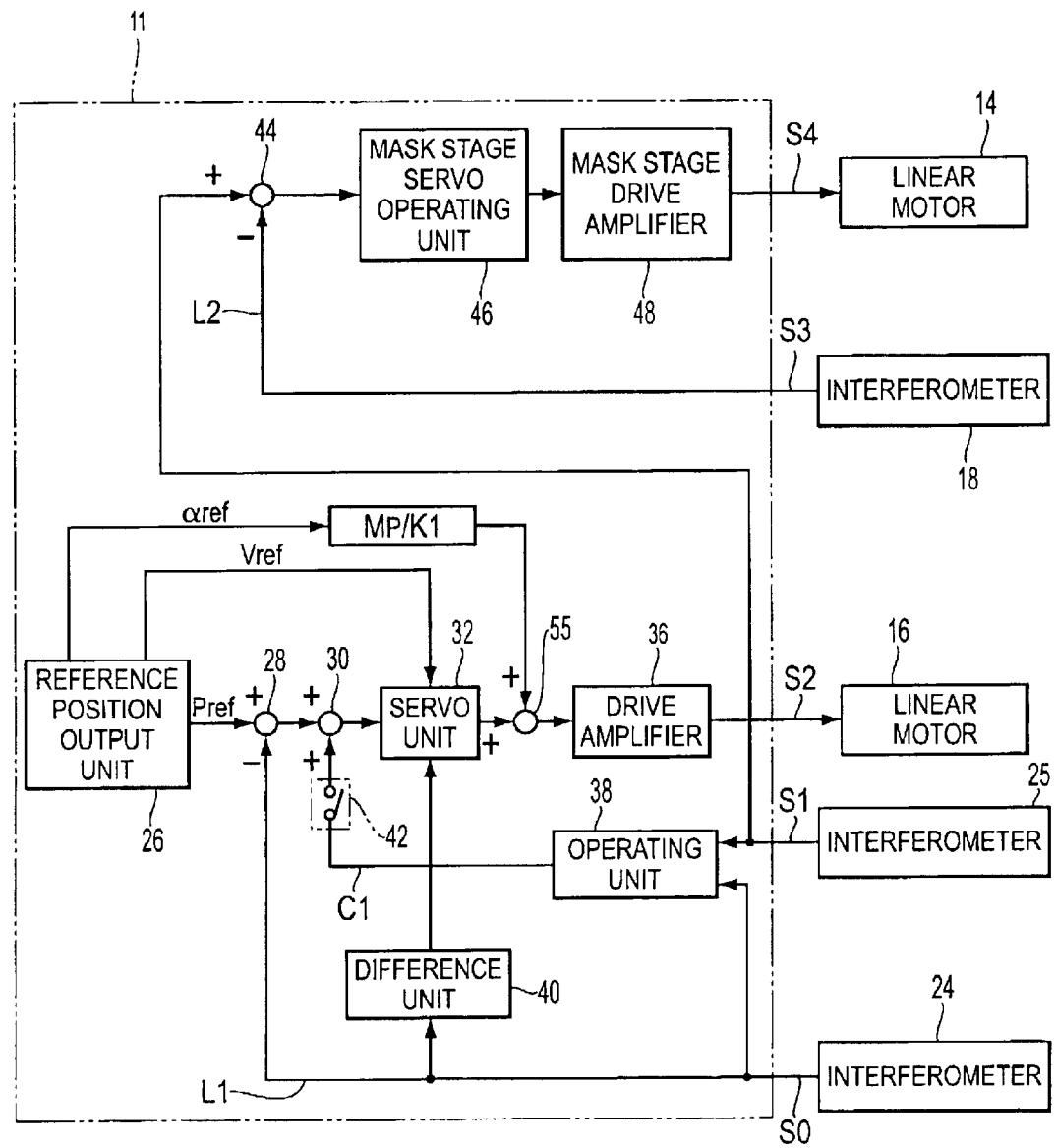
FIG. 2 is a block diagram of the stage control device depicted in FIG. 1.
Figure 3:
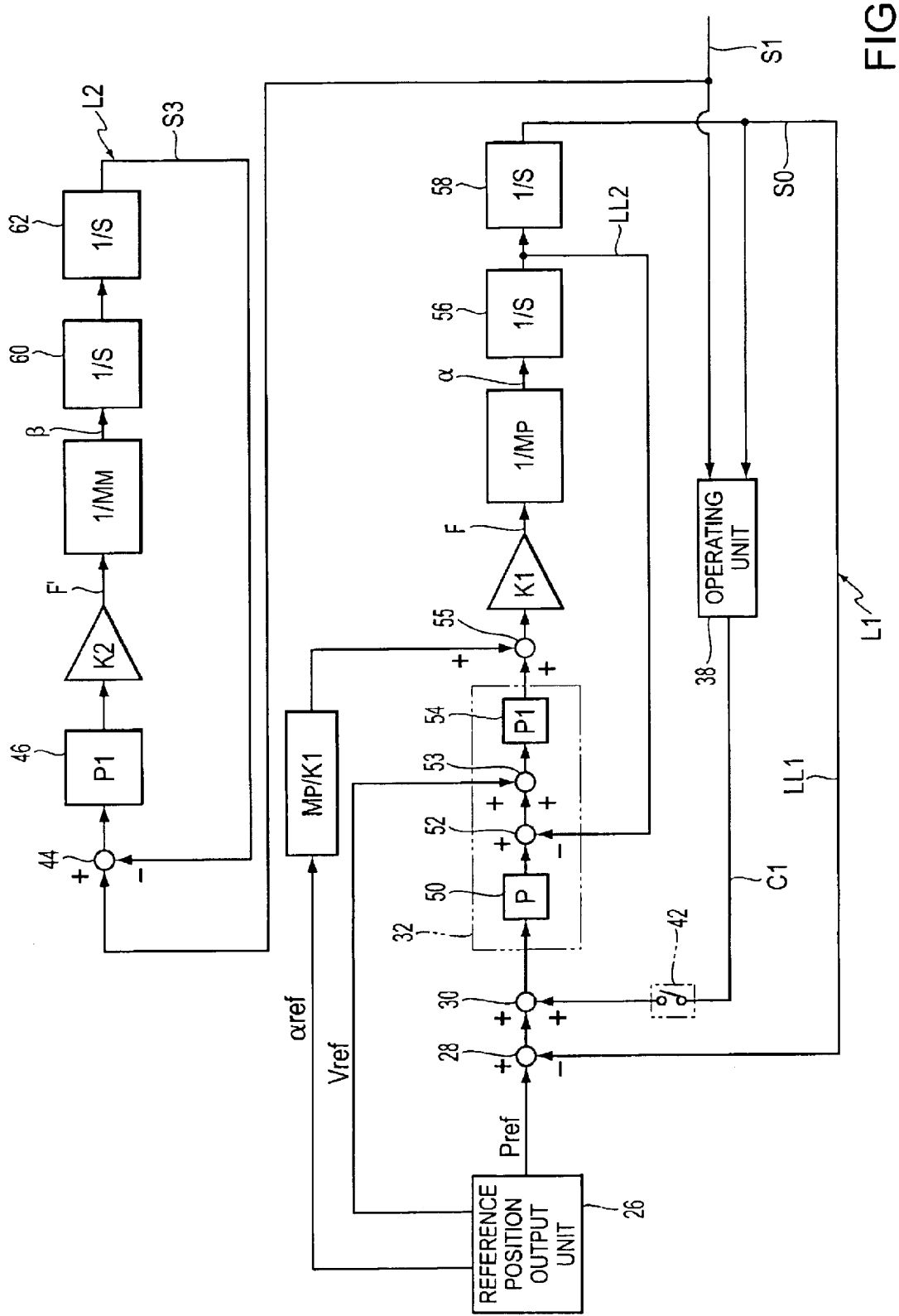
FIG. 3 is a block diagram of a control device corresponding to the stage control device depicted in FIG. 2.

Referring now to FIGS. 2 and 3, depicted therein are block diagrams of control device 11 and a stage control system, respectively. The control device 11 is equipped with a reference value output unit 26 which outputs a reference position Pref, a command speed Vref, and a command acceleration αref, with a subtractor 28 which calculates the actual position in the Y axis direction of the moving table 22 by taking the difference (position deviation) between the reference position Pref output from the reference value output unit 26 and the Y position information S0, which is output from the first interferometer 24 Control device 11 is further equipped with a plate stage servo operator 32 which inputs the output from the subtractor 28 and the command speed Vref as a feed-forward input from the reference value output unit 26, and with an adder 55 which adds the output of from plate stage servo operating unit 32 and the control amount corresponding to the command acceleration αref feed-forward input from the reference value output unit 26. Control device 11 is further equipped with plate stage drive amplifier 36 which converts the output of operator 55 to a plate stage drive signal S2 and provides it to the linear motor 16, and with a difference unit 40 which differences the position information S0 and inputs the result to the plate stage servo unit 32. The difference unit 40 finds the speed of moving table 22 by taking the difference in position information S0 between time intervals, for example, the difference in position information S0 from a previous sampling time to that of present sampling time.

Moreover, control device 11 is equipped with a subtracter 44 which calculates the position deviation in the Y axis direction of the mask stage MST and the substrate table 19 by taking the difference of between the Y position information S3 output from the interferometer 18 for mask use and the Y position information S1 which was output from the second interferometer 25 with a mask stage servo operating unit 46 which inputs the output from the subtracter 44, and with a mask stage drive amplifier 48 which converts the output of the mask stage servo operating unit 46 into a mask stage drive signal S4 and provides this to the linear motor 14.

The aforementioned plate stage servo operating unit 32, as shown in more detail in FIG. 3, can be constituted for example, by a P controller 50 which performs a control operation (proportion) as an operation signal the position deviation from the operator 28, by a subtractor 52 which calculates the speed deviation which is the difference of the speed command value output from this P controller 50, and the output of the integrating circuit 56 of FIG. 3 corresponding to the output of the difference unit 40 of FIG. 2 (namely, the actual speed of the moving table 22), by a PI controller 54 which performs control operation combining (proportion+integration) control operation (PI control operation) and phase lead compensation control, with the speed deviation which is the output of this operator 53 as the operating signal. Furthermore, the PI controller 54 is a phase lead compensation circuit, such as, for example, a built-in CR circuit.

As shown in FIG. 2 the first interferometer 24 for plate use, the subtractor 28, the difference unit 40, the plate stage servo operating unit 32, the plate stage drive amplifier 36 and the linear motor 16, make up a multiple loop control system L1 which is shown in FIG. 3. Multiple loop control system L1 has the position control loop LL1 which performs proportional control of the position of the plate stage PST, and speed control loop LL2 constituting its inner loop (minor loop) which performs the aforementioned combined operation of the PI control operation and phase lead compensation control.

By means of multiple loop control system L1, the plate stage position and speed control system L1 is constituted as the first stage control system. Here, the plate stage position and speed control system L1, for example, as a multiple loop control system, provides improvement to the steady speed deviation and the like.

The aforementioned mask stage operating unit 46, FIG. 3, can be constituted by means of a PI controller, such as shown in FIG. 3, which performs PI control operation with the position deviation from the subtractor 44 as an operating signal.

In the present preferred embodiment, by means of the mask use interferometer 18, subtractor 44, mask stage servo operating unit 46, mask stage drive amplifier 48, and linear motor 14, as shown in FIG. 2, make up the mask stage position control system L2. Mask stage position control system L2 is constituted as a second stage control system which performs position control of the mask stage MST, considering as a reference value the Y position information S1 of the substrate table 19 from the second interferometer 25. The mask stage position control system L2, controls the mask stage MST with respect to the plate stage PST, with the Y position information S1 of the substrate table 19 as the reference input. For reasons similar to those mentioned above, it makes no difference if the mask stage control system is made as a multiple loop control system similarly to the plate stage position and speed control system L1.

Furthermore, in the preferred embodiment shown in FIG. 2 and, in particular, in the control device 11, the position difference (error) of the position of the substrate table 19 and the position of the moving table 22 is found based on the position information S1 and the position information S0. The operating unit 38 is disposed in order to calculate the instruction value in order to compensate this error, and the output of this operating unit 38 is connected via a switch circuit 42 to an adder 30 arranged between the subtractor 28 and the plate stage servo operating unit 32. The switch circuit 42 is normally OFF and is set ON as necessary by the main control device (not shown in the drawing). When switch circuit 42 is ON, the integral of the difference of the position of the substrate table 19 and the position of the moving table 22, is input to the above plate stage position and speed control system L1 (specifically, the position control loop LL1) as a compensation value (instruction value to compensate the aforementioned error). Namely, a compensation system C1 is constituted by means of the operating unit 38 and the switch circuit 42, and compensates for the difference (error) of the position of the substrate table 19 and the position of the moving table 22.

Control device 11 can be constituted by a microcomputer, microprocessor arrangement, etc., and, of course, the function of each portion of FIG. 2 may be carried out by software of a microcomputer, microprocessor arrangement, etc., or by firmware.

Next, the specific control operation of the aforementioned plate stage position and speed control system L1 is described based on FIG. 3 while referring to FIG. 2. For the purpose of the following discussion, the switch circuit 42 will be considered to be OFF.

When the signal of the reference position Pref of the plate stage PST is output from the reference position output unit 26, the position deviation is calculated by taking the difference between the reference position Pref and the Y position information S0 from the first interferometer 24. With the position deviation as an operating signal, the P controller 50 performs proportional control operation, and as a result, a speed instruction value is provided to the subtractor 52 from the P controller 50. The subtractor 52 calculates the speed deviation, which is the difference of this speed instruction value and the actual speed of the moving table 22, which is the output of the integration circuit of FIG. 3 (in actuality, the speed of the moving table 22 which is found by means of differencing the previous sample value of the position of the moving table 22 and the present sampling value, and is calculated by the difference unit 40 of FIG. 2). The adder 53 adds this speed deviation to the instruction speed Vref. With the instruction speed Vref to which was added the speed deviation as an operating signal, the PI controller 54 performs the combined control operations of PI control operation and phase lead compensation control. As a result, a predetermined thrust instruction value (control amount) from the PI controller 54 is output from the adder 55. The instruction acceleration αref, the thrust value (control amount) converted by means of the operation gain MP/K1 (this is gain corresponding to a value excluded by a thrust conversion gain K1, mentioning below the mass MP of the plate stage PST), is input to adder 55. Then, in adder 55, the output from the gain MP/K1 and the output from the plate stage servo operating unit 32 are added. Then, the control amount (thrust instruction value) which is the output of adder 55 is converted by means of the thrust conversion gain K1 to a force F. Force F, as is clear from FIG. 3, corresponds to the sum of the thrust conversion value (MP·αref) of the acceleration αref, which is a feed-forward input from the reference value output unit 26, and of the thrust conversion value of the output of the plate stage servo operating unit 32.

Here, when describing the correspondence of the operation of the aforementioned thrust conversion gain K1 and the actual phenomena, the equivalent is that the thrust instruction value from the adder 55 is provided to the plate stage drive amplifier 36 of FIG. 2, the plate drive signal S2 is provided from the said amplifier 36 to the linear motor 16, and the linear motor 16 generates the force F.

Then, the plate stage PST is driven in the Y axis direction at an acceleration α corresponding to this thrust (F). The phenomenon, that is, the driving of the plate stage PST, or, in other words, the aforementioned thrust F, by means of the operation of the gain (1/MP) corresponding to the reciprocal of the mass of the plate stage PST, is equivalent to being converted to an acceleration α. In FIG. 3, the gain (1/MP) is shown as a constitutional element of the control system.

Then, the aforementioned acceleration α is successively converted to a velocity and a position by the integrating circuits 56 and 58. Speed information is input as a feedback to the subtractor 52, and in addition, position information S0 is input as a feedback to the aforementioned subtractor 28. The position and speed control of the plate stage PST is performed by means of the plate stage position and speed control loop L1, such that the position deviation, which is the difference of the reference position Pref and the position information S0 from the plate use interferometer 24, becomes zero.

In the present preferred embodiment, in addition to the reference position Pref, the instruction speed Vref and the instruction acceleration αref are fed as inputs to the plate stage position and speed control system L1 (see FIG. 3). This, in addition to the feedback loop of position of the plate stage, and by controlling the plate stage PST by speed and acceleration feed-forward, increases the control performance of the whole system containing the plate stage PST. Furthermore, the controllability, for example, position control responsiveness, of the plate stage PST by the control device 11, for example, can be further increased.

Moreover, the integrating circuits 56, and 58 of FIG. 3 do not in fact exist. The speed signal which is the output of the integrating circuit 56 is the output of the difference unit 40, and the output S0 of the integrating circuit 58 is the output of the interferometer 24. But, instead, in FIG. 3, integrating circuits 56 and 58 are shown in the drawing according to the conventional manner of drawing control loops.

Furthermore, the specific control operation of the mask stage position control system L2 is described based on FIG. 3 with continued reference to FIG. 2.

When position information S1 is input from the second interferometer 25 to the subtractor 44, the position deviation, which is the difference of the position information S1 and the Y position information S3 from the mask use interferometer 18, is calculated by the subtractor 44. Next, the PI controller 46 performs a PI control operation with this position deviation as an operating signal, with the result that a predetermined control amount (control amount corresponding to the mask stage drive signal S4 of FIG. 2) is output from the PI controller 46. Then, this control amount is converted into a force F' by means of a thrust conversion gain K2. The operation of thrust conversion gain K2 corresponds with the actual phenomenon as follows: a predetermined control amount from the PI controller 46 is provided to the mask stage drive amplifier 48 of FIG. 2, and a mask stage drive signal S4 is provided from the said amplifier 48 to the linear motor 14, which is equivalent to the linear motor 14 generating a thrust F'.

Then, the mask stage MST is driven in the Y axis direction at an acceleration corresponding to thrust (F'). By means of operating a gain (1/MM) corresponding to the reciprocal of the mass of this mask stage MST, it is equivalent to conversion to an acceleration β. As such, the gain (1/MM) is shown in FIG. 3 as a constitutional element of the control system.

Then, the aforementioned acceleration β is successively converted to a velocity and a position by the integrating circuits 60 and 62. Position information S3 is input as a feedback to the subtractor 44. By this means, and by means of the mask stage position control loop L2, following control of the mask stage MST with respect to the plate stage PST is performed such that the position deviation, which is the difference of the position information S1 from the second interferometer 25 for plate use and the position information S3 from the mask use interferometer 18, becomes zero.

The exposure device 10 in the present embodiment, during scanning exposure, by means of a stage control device equivalent to the aforementioned control system of FIG. 3, performs fixed speed control of the plate stage PST and following control of the mask stage MST with respect to the plate stage PST, based on the reference position (corresponding to the variable speed instruction) from the reference value output unit 26.

In this case, the plate stage control performance can be raised in the plate stage position and speed control system L1 as a result of the following: the Y position information S0 of the moving table 22 from the first interferometer 24 is input as plate stage position information, due to the existence of the Z·θ drive mechanism 20, even if a mechanical natural frequency arises between the moving table 22 and the substrate table 191 within the aforementioned plate stage position and speed control system L1. Because the aforementioned natural vibration is not included as a resonant mode, the servo response band can be enlarged.

In FIG. 4(A) and (B), the gain characteristic and phase characteristic (Bode diagram) are respectively shown in the frequency response characteristics of a stage control device according to the present embodiment obtained by simulation results with the aforementioned natural vibration frequency taken as 60 Hz.

In FIG. 4(A), the symbol G1(f), in the case that a measurement value of the interferometer 24 is output, represents the gain characteristic showing the response of the system with respect to the reference position (input); the symbol G2(f) shows the gain characteristic showing the response of the system with respect to the reference position (input) in a case in which the position value of the interferometer 25 was output. Moreover, in FIG. 4(B), P1(f) and P2(f) respectively show the position characteristic with respect to G1(f) and G2(f) of FIG. 4(A).

As can be gathered from G2(f) of FIG. 4(A), in the present embodiment, the servo response band becomes about 20 Hz, and when compared with the gain characteristic shown in FIG. 7(A), the present embodiment has a response band enlarged by about 10 Hz.

Additionally, because the system can faithfully follow inputs, it is possible to shorten the adjustment time with respect to the reference scanning speed of the plate stage. In other words, when the adjustment time is set as the same time, the reference scanning speed of the plate stage PST can be a higher speed.

Moreover, by means of enlarging the aforementioned response band, the overshoot and undershoot after the end of the variable speed of the plate stage PST can be made small. By using the position of the substrate table 19 as a reference value performed by means of the mask stage position control loop L2, the following control performance of the mask stage MST with respect to the plate stage PST is increased. Accordingly, the uniform speed simultaneous adjustment time of the plate stage PST and the mask stage MST in order for scanning exposure is shortened, or it becomes possible to increase the scanning speed of both the stages MST, PST. Furthermore, the control performance of the plate stage PST and the following performance of the mask stage MST with respect to the plate stage PST are raised, with the result that during uniform speed control of both stages during exposure, uniform speed control of both stages can be realized which is closer to the ideal. By this means the superposition accuracy of the mask and plate can be increased, and it is possible to increase the pattern transfer accuracy, namely the exposure accuracy.

Moreover, in the present embodiment, variability of the position of the substrate table 19 and the position of the moving table 22 arises, by means of performing position control of the moving table 22, in order to realize position control of the plate stage PST, strictly. However, during the scanning exposure, no disadvantages arise because simultaneous control of mask and substrate is realized via plate stage fixed speed control by the projection optical system PL and by means of the following control of the mask stage with respect to this plate stage.

Furthermore, during alignment time and the like, in the case that strict position setting of the plate stage PST is necessary, after the end of half speed reduction after movement, the difference of the substrate table position and the moving table position is integrated over time by means of the operating unit 38, by means of setting ON the switch circuit 42 which constitutes the compensation system C1, and by means of the main control device (not shown in the drawing). This integrated value is input as a feed-forward correction value to the plate stage position control loop LL1, and can cause the substrate table 19 (not the moving table 22) to accurately stop in the reference position Pref.

Furthermore, an illuminating optical system constituted by plural lenses, such as the projection optical system, makes an optical adjustment built into the exposure device body, and in addition, a mask stage and a plate stage consisting of plural mechanical components may come into contact with wiring or piping mounted in the exposure device body. Moreover, the exposure device of this embodiment can be manufactured by coordinated adjustment (electrical adjustment, operation confirmation and the like). The manufacture of the exposure device is preferably carried out by providing and assembling component parts in a clean room in which temperature and cleanliness are controlled.

In the aforementioned embodiment, the present invention has been described suited to a liquid crystal use scanning type exposure device of the uniform batch magnification transfer type. However, the present invention is not limited as such this, and can, of course, be suitable for application to step and repeat types of liquid crystal steppers, step and scan types of liquid crystal steppers, semiconductor steppers, scanning steppers, and, the like. Moreover, the present invention can also be applied to a longitudinal type exposure device which supports a mask M and plate P along the vertical direction.

As already mentioned above, by means of the stage device according to the invention, (the present invention is applied to a stepper or scanning stepper and the like sequential movement type of exposure device), it is possible to raise the throughput and to raise the position setting performance in the stepping time between shots and in the movement time to the alignment position because the position control function of the substrate stage can be caused to rise. In particular, in raising the position setting of the substrate stage, it is preferable to equip the compensation system similarly to the compensation system C1 in the aforementioned embodiment.

It is also possible to apply the stage device, according to the present invention, to an electron beam exposure device or an X-ray exposure device and the like exposure devices, or a device which is equipped with a substrate stage which supports the substrate and moves, such as, for example, a laser repair device and the like.

Moreover, the throughput of an exposure device can be increased by means of disposing plural stages. Furthermore, plural plates P may be positioned on plural plate stages PST. Similarly, plural masks may be positioned on plural mask stages MST.

Next, a second preferred embodiment of the present invention is described with reference to FIG. 8. The above-described first preferred embodiment and the following second preferred embodiment can be used in suitable combination.

A complete schematic side view of a scanning exposure device of a second preferred embodiment is shown in FIG. 8. In particular, the illuminating optical system 201 is fixed to the base 210 by means of the B column 208 integral with the base 210, constituted by light source, a light guide, a fly's eye lens, a visual field stop, and a condenser lens. Illuminating light radiated from a light source of a high pressure mercury lamp and the like is irradiated onto the illumination region on a mask 202 with uniform illumination. The mask 202 is supported via a mask stage 203 in the upper portion of a carriage 207 of U-shaped cross section. The mask 202 is minutely moved with respect to the carriage 207 integrally with the mask stage 203. A substrate 205, which is a rectangular glass plate coated with a photoresist, is supported via a substrate stage 206 in the lower portion of the carriage 207, the substrate stage 206 is supported to minutely move freely on the lower surface of the carriage 207.

The carriage 207 is movably supported on non-contact type bearings 210, such as air bearings, magnetic bearings, etc., and moves in the X direction in FIG. 8. In this embodiment, the carriage 207 is driven by a linear motor. A projection optical system 204 between the mask 202 and the substrate 205 projects an erect image at equal magnification and is fixed to the base 210 by means of the B column 208 (the fixed portions are drawn with thick lines, and the movable portions are drawn with thin lines). The pattern (for example, a liquid crystal display element pattern) on the mask 202 therefore, is exposed as an equal magnification erect image on the substrate 205 via the projection optical system 204. Then, by integrally scanning the mask 202 and substrate 205 by driving the carriage 207 in the X direction, the pattern on the mask 202 is sequentially exposed on the substrate 205. A laser interferometer 215 is supported on the A column 209 and detects the position of the projection optical system 204 by means of the interference of the light reflected from a fixed mirror 211 located in the projection optical system 204 and light reflected from a fixed mirror 213 located on the A column 209. Another laser interferometer 216 is supported on the A column 209 and detects the position of the substrate stage 206 by means of the interference of the light reflected from a moving mirror 212 arranged on the substrate stage 206 and the light reflected from a fixed mirror 214 arranged on the A column 209. Position information of the projection optical system 204 from the laser interferometer 215 and position information of the substrate stage 206 from the laser interferometer 26 input into the main control device 230. Due to the movement of the carriage 207, the B column 208 vibrates at its natural frequency (for example, 50 Hz), and the position of the projection optical system 204, together with the fixed mirror 211 fixed to the projection optical system 204, are displaced due to the bending movement of the B column 208.

Because of this, the main control device 230 is equipped with a correction unit 219 which outputs the corrected position information of the projection optical system 204, based on a variable speed calculation unit 218 which outputs a variable speed instruction according to the exposure program, and based on the variable speed instruction and position information of the projection optical system 204. Main control device 230 is further equipped with a servo operating unit 220 which outputs an operating drive signal of the carriage 207 based on the variable speed instruction and the position information of the substrate stage 206 output from the correction unit 219, and with a drive amplifier 221 which amplifies the output of the servo operating unit 220. The correction unit 219 corrects the position information of the projection optical system 204 of the A column 209 according to the following equations:

$$Y_1(s) = \frac{2\pi f_1}{s + 2\pi f_1} \cdot X_1(s) \quad (1)$$

$$W(s) = \frac{s^2 + s + (2\pi f_3)^2}{s^2 + cs + (2\pi f_2)^2} \quad (2)$$

$$W^{-1}(s) = \frac{s^2 + cs + (2\pi f_2)^2}{s^2 |s| (2\pi f_3)^2} \quad (3)$$

$$Y_2(s) = W^{-1}(s) \cdot X_2(s) \quad (4)$$

$$Z(s) = a_1 Y_1(s) + a_2 Y_2(s) \quad (5)$$

Where,
$X_1(s)$=Laplace transform of position of projection optical system 204;
$X_2(s)$=Laplace transform of acceleration instruction x(t);
$Y_1(s)$=Laplace transform of $x_1(t)$ filter processed by low pass filter;
$Y_2(s)$=Laplace transform of $x_2(t)$ filter processed by second order filter;
$W(s)$=bending vibration of B column 208;
$W^{-1}(s)$=reciprocal of bending vibration of B column 208;
$Z(s)$=Laplace transform of corrected position z(t) of projection optical system 204;
$f_1$=cutoff frequency of low pass filter;
$f_2$=bending resonant frequency of the B column 208 which it is desired to follow;
$f_3$=bending resonant frequency of the B column 208; and
$a_1$, $a_2$, c=appropriate weighting coefficients.

In correction unit 219 which corrects the position information of the projection optical system 204, Equation (1) shows the low pass filter with $f_1$ as a cutoff frequency with respect to the position x1(t) of the projection optical system. For example, in the case that the natural vibration frequency of the B column 208 is 50 Hz, taking the cutoff frequency f1=17 Hz, the 50 Hz frequency component is eliminated. By this means, even if the B column vibrates at 50 Hz which is its natural frequency, its effect is not exerted in the servo loop. Accordingly, even raising the servo performance, the generation of the 50 Hz natural frequency of the B column 208 does not result. Moreover, the servo loop does not follow with respect to the natural frequency of the B column 208, but position setting of the projection optical system 204 with respect to the mask 202 and substrate 205 does not require high accuracy at a high frequency because the mask 202 and substrate 205 travel integrally with respect to the projection optical system 204, if scanned well at a substantially uniform speed such that the amount of exposure becomes uniform. Namely, even if the position of the projection optical system 204 with respect to the mask 202 and substrate 205 vibrates at a high frequency, the process of scanning becomes uniform, and impediments to the exposure result do not arise.

Equation (2) represents the bending vibration of the B column 208, and Equation (3) represents the reciprocal of the bending vibration of the B column 208. Equation (4) represents the inverse system of the bending vibration of the B column 208 predicted with respect to the variable speed instruction x2(t). By means of this term it can become a high speed response system by feed-forward predicting the bending vibration of the B column 208 with respect to the variable speed instruction x2(t).

Taking as the output of the correction unit 219, as shown in Equation (5), the weighted average of the aforementioned two equations, it does not receive the effect of the natural frequency of the B column 208, and yet it is as a high speed response by means of feed-forward from the variable speed instruction x2(t).

The correction unit 219 may be as a pure low pass filter as a2=0, or may be a band stop filter instead of a low pass filter. There is no limitation to this embodiment of the present invention. Furthermore, with a1=0, it may be one which predicts the bending vibration based on the variable speed instruction.

A control unit 217 drive-controls the carriage 207 by means of the output of the drive amplifier 221. These laser interferometer 216, main control device 230 and control unit 217 constitute a servo loop, which provides following control of the carriage 207 and thus of the substrate stage 206 based on the variable speed instruction output from the variable speed control unit 218, the position information of the projection optical system 204 of A column 209 reference, and the position information of the substrate stage 206.

In the above constitution, firstly in order to perform the position combination of the mask 202 and substrate 205, moving the mask stage 203 coincidingly forms a mask side alignment pattern on the mask 202 and a substrate side alignment pattern on the substrate 205. Then, the carriage 207 is caused to travel at a uniform speed, thus completing, the transfer and printing of the pattern region on the mask 202 onto the substrate 205.

The control unit 217, other than driving the carriage 207, may be one which directly drive controls the substrate stage 206.

Servo operating unit 220 operates with respect to an input-output table may be stored in a memory.

Even if the stage which detects position is a mask stage 203 which positions the mask 202 of the exposure device, it may be the substrate stage 206 which positions the substrate 205.

A reference unit which arranges the fixed mirror 211 may be, other than the projection optical system 204, the illumination optical system 201, the A column 209, B column 208, etc.

As the exposure device, in an exposure device of the step and repeat type which causes successive step movements of the substrate 205, a proximity form of the exposure device can be applied which exposes causing closeness of the mask 202 and the substrate 205 exposing the mask 202 and the substrate 205 at each stationary state. In these, the variable speed device would be one for stepping, would be one in order for position combination of fine movements, and the like, all included to drive the stage(s).

The linear motor which drives the carriage is constituted by a moving element (for example, a coil) and a fixed element (for example, a permanent magnet). If this fixed element is disposed in a frame insulated from vibration of base 210, because the reaction force which arises during driving the carriage 207 transmits to the frame, it is transmitted only with difficulty to the base 210. Because of this, the vibration of the base 210 can be reduced.

The scanning type exposure device of this second embodiment performs optical adjustment of the illumination optical system 201, of the projection optical system 204, which have plural lenses, and in addition, of the mask state 203 and substrate stage 206, which consist of numerous mechanical components, mounted on the carriage 207, and can produce by means of the performance of overall control (electrical adjustment or operation confirmation, etc.) connecting the main control device 230.

As such, not only can a KrF excimer laser (248 nm), ArF excimer laser (193 nm), $F_2$ laser (157 nm), but also X-ray and electron beam and the like charged particle beams used, but, for example, in the case of using an electron beam as an electron gun, a lanthanum hexaboride ($LaB_6$), tantalum (Ta), thermionic emission type may be used.

The magnification of the projection optical system 204 may be a reducing system, equal magnification system or enlarging system. Moreover, as the projection optical system 204, using quartz or fluorite as a glass material in the case of using an excimer laser, a catadioptric optical system in the case of using X-rays (a reflecting type mask is also used), moreover, an electro-optical system consisting of electron lenses and deflecting system may be used in the case of using an electron beam. Furthermore, the light path along which the electron beam passes is evacuated.

The stage device of the present invention as described above can raise stage control performance, avoiding the effects of a mechanical natural frequency. Moreover, the stage device of the present invention has the effect that it can raise the control performance of the second stage in order to adjust the positional relationship of the second stage with respect to the first stage.

The illuminating device of the present invention can provide an increase of the throughput and pattern transfer precision. Moreover, by means of the position detection device of the present invention, from the servo loop which controls the stage which is capable of movement, eliminating the effect of vibration of the reference unit in order to detect the position of the stage, raising the stage control performance, the stage can be controlled at high speed.

The present invention and all of its embodiments, as described above, has been described using terms well known in the art and will be readily understood by one having ordinary skill in the art.

Thus, having fully described the present invention by way of example with reference to the attached drawing figures, it will be readily appreciated that many changes and modifications may be made to the invention and to the embodiments shown and/or described herein without departing from the spirit or scope of the present invention which is defined in and covered by the appended claims.

What is claimed is:

1. A stage device, comprising:
    a movable stage which has a first portion to support an object and a second portion, said first portion having a support surface to support said object;
    a first drive mechanism which drives said movable stage in at least a first direction that is parallel to said support surface, at least part of the first drive mechanism being coupled to said second portion;
    a second drive mechanism located between said first portion and said second portion to move said first portion in a second direction that crosses said support surface;
    a first position detector which detects a position of said first portion in a predetermined first direction, said first position detector being optically connected to said first portion; and a second position detector which detects a position of said second portion in said predetermined first direction, said second position detector being optically connected to said second portion.

2. The stage device according to claim 1, further comprising:
a stage controller which controls said first drive mechanism based on detection results obtained by said first position detector and said second position detector.

3. The stage device according to claim 1, wherein said first portion and said second portion are integrally formed.

4. The stage device according to claim 1, wherein said first drive mechanism comprises a linear motor.

5. An exposure apparatus which transfers a pattern of a mask onto an object, comprising:
an object stage which has a first portion to support said object and a second portion, said first portion having a support surface to support said object;
a first drive mechanism which drives said object stage in at least a first direction that is parallel to said support surface, at least part of the first drive mechanism being coupled to the second portion;
a second drive mechanism located between said first portion and said second portion to move said first portion in a second direction that crosses said support surface;
a first position detector which detects a position of said first portion in a predetermined first direction, said first position detector being optically connected to said first portion; and
a second position detector which detects a position of said second portion in said predetermined first direction, said second position detector being optically connected to said second portion.

6. The exposure apparatus according to claim 5, further comprising:
a stage controller which controls the first drive mechanism based on a detection result obtained by said first position detector and said second position detector.

7. The exposure apparatus according to claim 5, wherein the exposure apparatus is a scanning type exposure apparatus which transfers said pattern while causing said mask and said object to move simultaneously.

8. The exposure apparatus according to claim 6, further comprising a projection system which projects said pattern onto said object, said projection system disposed between said mask and said object.

9. The exposure apparatus according to claim 8, wherein said second drive mechanism drives said object along an axis direction of said projection system.

10. A method of manufacturing an exposure device, comprising the steps of:
providing a stage device having a first stage which movably supports an object by a support surface;
providing a first drive mechanism which drives said first stage in at least a first direction that is parallel to said support surface, said first stage having a first portion coupled to said first drive mechanism and a second portion having said support surface, said first stage device including a first position measuring device which measures a position of said first portion in a predetermined measurement direction;
providing a second drive mechanism located between said first portion and said second portion to move said second portion in a second direction that crosses said support surface; and
providing a first stage control system which controls said first drive mechanism to control the position of said object at least in said first direction based on a measurement result obtained by said first position measuring device.

11. A method of detecting a position of a stage device that includes a movable stage which has a first portion to support an object by a support surface, a second portion and a drive mechanism which drives the movable stage in at least a first direction parallel to said support surface, at least part of the drive mechanism being coupled to the second portion, comprising the steps of:
moving said movable stage by said drive mechanism in said first direction;
moving said first portion in a second direction that crosses said support surface;
detecting a position of the first portion in a predetermined first direction with a first position detector that is optically connected to the first portion; and
detecting a position of the second portion in the predetermined first direction with a second position detector that is optically connected to the second portion.

12. The method according to claim 11, further comprising:
controlling the drive mechanism based on detection results obtained by the first position detector and the second position detector.

13. The method according to claim 11, wherein the first portion and the second portion are integrally formed.

14. The method according to claim 11, wherein the drive mechanism comprises a linear motor.

15. A method of detecting a position of an exposure apparatus which transfers a pattern of a mask onto an object and that includes an object stage which has a first portion to support the object by a support surface, a second portion and a drive mechanism which drives the object stage in at least a first direction parallel to said support surface, at least part of the drive mechanism being coupled to the second portion, the method comprising the steps of:
moving said object stage by said drive mechanism in said first direction;
moving said first portion in a second direction that crosses said support surface;
detecting a position of the first portion in a predetermined first direction with a first position detector that is optically connected to the first portion; and
detecting a position of the second portion in the predetermined first direction with a second position detector that is optically connected to the second portion.

16. The method according to claim 15, further comprising:
controlling the drive mechanism based on a detection result obtained by the first position detector and the second position detector.

17. The method according to claim 15, wherein the exposure apparatus is a scanning type exposure apparatus which transfers the pattern while causing the mask and the object to move simultaneously.

18. The method according to claim 16, wherein the exposure apparatus includes a projection system which projects the pattern onto the object, the projection system disposed between the mask and the object.

19. The method according to claim 18, further comprising driving the object along an axis direction of the projection system with a second drive mechanism.

20. The method according to claim 15, further comprising driving the object in a direction different from the first direction with a second drive mechanism.

* * * * *